United States Patent
Angyal et al.

(10) Patent No.: US 7,214,608 B2
(45) Date of Patent: May 8, 2007

(54) INTERLEVEL DIELECTRIC LAYER AND METAL LAYER SEALING

(75) Inventors: Matthew S. Angyal, Stormville, NY (US); Peter E. Biolsi, New Windsor, NY (US); Lawrence A. Clevenger, LaGrangeville, NY (US); Habib Hichri, Wappingers Falls, NY (US); Bernd E. Kastenmeier, Austin, TX (US); Michael W. Lane, Cortlandt Manor, NY (US); Jeffrey R. Marino, Fishkill, NY (US); Vincent J. McGahay, Poughkeepsie, NY (US); Theodorus E. Standaert, Pine Bush, NY (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 10/710,706

(22) Filed: Jul. 29, 2004

(65) Prior Publication Data
US 2006/0024961 A1 Feb. 2, 2006

(51) Int. Cl.
*H01L 21/4763* (2006.01)

(52) U.S. Cl. .................................................. 438/622
(58) Field of Classification Search ................ 438/692, 438/687, 641, 629, 660, 622
See application file for complete search history.

(56) References Cited

U.S. PATENT DOCUMENTS

| | | | |
|---|---|---|---|
| 6,399,486 B1 * | 6/2002 | Chen et al. ................ | 438/660 |
| 6,576,546 B2 * | 6/2003 | Gilbert et al. ............ | 438/629 |
| 2004/0198055 A1 * | 10/2004 | Wang ....................... | 438/692 |

* cited by examiner

*Primary Examiner*—Carl Whitehead, Jr.
*Assistant Examiner*—Monica D. Harrison
(74) *Attorney, Agent, or Firm*—Lisa U. Jaklitsch; Hoffman, Warnick & D'Alessandro LLC

(57) ABSTRACT

Methods for sealing an organic ILD layer and a metal layer after an etching step. The method includes etching through an ILD layer and leaving a remaining portion of an underlying metal layer cap, maintaining the device in an inert gas, and depositing at least a portion of a liner into the opening to seal the ILD layer and the metal layer. Subsequent processing may include formation of a via by etching through the portion of the liner and the remaining portion of the cap layer, and depositing a metal.

20 Claims, 1 Drawing Sheet

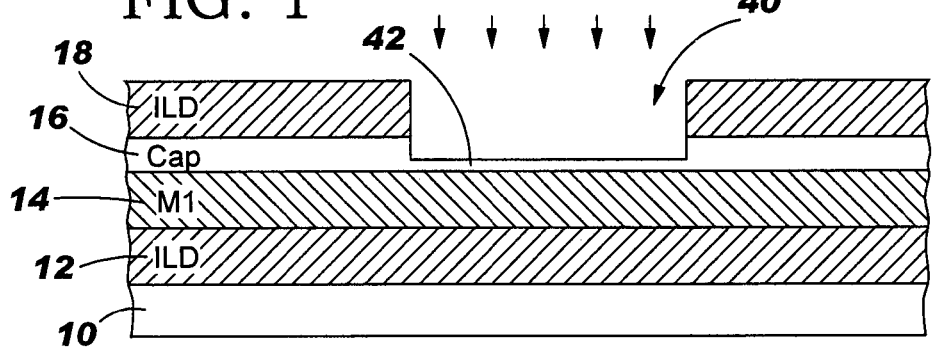
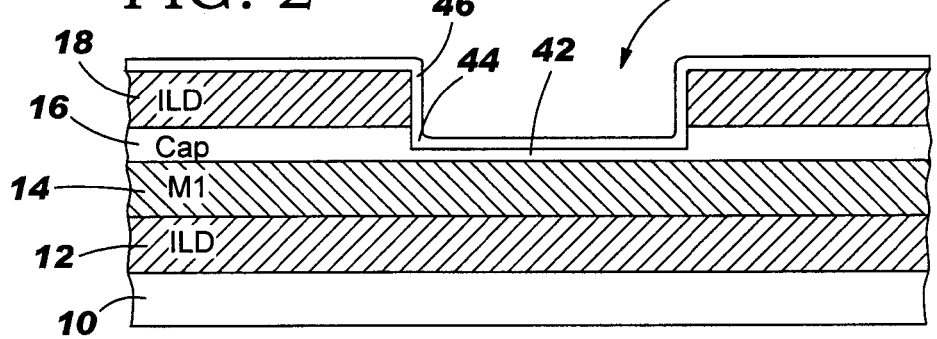
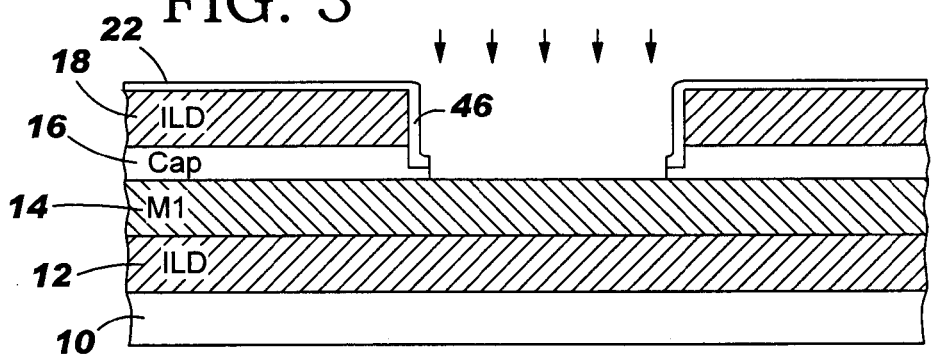
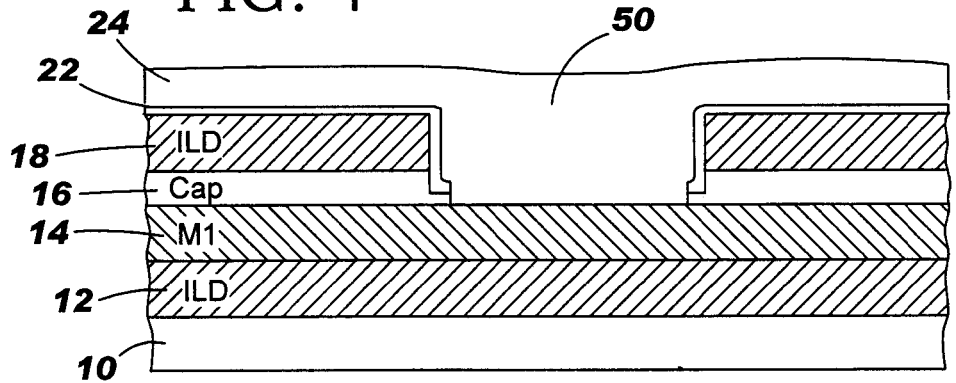

INTERLEVEL DIELECTRIC LAYER AND METAL LAYER SEALING

BACKGROUND OF INVENTION

1. Technical Field

The present invention relates generally to semiconductor fabrication, and more particularly, to methods for sealing an interlevel dielectric layer and metal layer.

2. Related Art

In semiconductor fabrication, processing requires two separate steps during generation of organic interlevel dielectric layers (ILDs) and metal layers in which the wafer is exposed to atmosphere including, for example, air, moisture, and possibly other chemicals. In particular, wafers are etched during via generation in such a way that organic ILD layers (e.g., SiLK by Dow Chemical) above the metal layer are opened and the metal layer is exposed to atmosphere when the wafer is moved between the etch chamber and deposition chamber for the metallization of the vias. In these instances, the organic ILD layers adsorb contaminants from the atmosphere, which can be later released during processing of upper levels where the wafer is exposed to thermal treatment. When these contaminants are released, they diffuse toward the weak interface of metal and dielectric, and create a resistive layer that hinders the electrical connectivity. In addition, contaminants can diffuse to the exposed metal interface of, for example, copper (Cu), and create an oxide layer. The oxide layer affects the electrical contact with the upper level metal.

In view of the foregoing, there is a need in the art for way to eliminate exposure of organic ILD (such as SiLK) and metal layers to any undesired atmosphere.

SUMMARY OF INVENTION

The invention includes methods for eliminating exposure of organic ILD layers and metal layers after an etching step. The method includes etching through an ILD layer and leaving a portion of an underlying metal layer cap, maintaining the device in an inert gas, and depositing at least a portion of a liner into the opening to seal the ILD layer and the metal layer. Subsequent processing may include formation of a via by etching through the portion of the liner and the remaining portion of the cap layer, and depositing a metal.

A first aspect of the invention is directed to a method of preventing exposure of at least one layer of a semiconductor device, the method comprising the steps of: etching an opening through an interlevel dielectric (ILD) layer and leaving a remaining portion of an underlying cap layer; maintaining the semiconductor device in an inert gas; and forming a portion of a liner in the opening to prevent exposure of the ILD layer during subsequent processing.

A second aspect of the invention is directed to a method of forming a via in a semiconductor device, the method comprising the steps of: first etching an opening through an interlevel dielectric (ILD) layer and leaving a remaining portion of an underlying cap layer; maintaining the semiconductor device in an inert gas; forming at least a portion of a liner in the opening to prevent exposure of the ILD layer; second etching through the at least a portion of the liner and the portion of the underlying cap layer to expose a metal layer; and forming the via in the opening.

A third aspect of the invention is directed to a method of forming a via in a semiconductor device, the method comprising the steps of: first etching an opening through an interlevel dielectric (ILD) layer and leaving a remaining portion of an underlying cap layer to maintain a metal layer thereunder sealed; maintaining the semiconductor device in an inert gas; degassing the semiconductor device; forming at least a portion of a liner in the opening to prevent exposure of the ILD layer in a chamber; second etching through the portion of the liner and the portion of the underlying cap layer to expose the metal layer in the chamber; and forming the via in the opening.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein:

FIG. 1 shows a first step of the method according to the invention.

FIG. 2 shows a second step of the method according to the invention.

FIG. 3 shows a third step of the method according to the invention.

FIG. 4 shows a fourth step of the method according to the invention.

DETAILED DESCRIPTION

With reference to the accompanying drawings, FIGS. 1–4 show schematic cross-sectional representations of methods of preventing exposure of at least one layer of a semiconductor device and generating a via according to the invention.

In FIG. 1, a substrate 10 is illustrated including a representative first interlevel dielectric (ILD) layer 12 thereon. Subsequent layers include a metal layer (M1) 14 on organic ILD layer 12, a metal layer cap layer 16 over metal layer 14 and another second organic ILD layer 18. Each layer may include any now known or later developed material used for the layer's respective purpose. In one embodiment, for example, substrate 10 may include silicon, ILD layers 12, 18 may include an organic low-k material such as SiLK by Dow Chemical, cap layer 16 may include silicon nitride (SiN) or silicon carbide (SiC), and metal layer 14 may include copper (Cu). It should be recognized that the material makeup of the layers may vary and not depart from the scope of the invention.

FIGS. 1–2 illustrate a method of preventing exposure of at least one layer of a semiconductor device; and FIGS. 1–4 illustrate a method of forming a via in a semiconductor device.

In a first step of the method, shown in FIG. 1, an opening 40 is etched through an organic interlevel dielectric (ILD) layer 18, leaving a remaining portion 42 of an underlying cap layer 16. In one embodiment, remaining portion 42 is no less than approximately 10% of the underlying cap layer thickness and no greater than approximately 90% of the underlying cap layer thickness. Subsequent to this step, the semiconductor device is maintain in an inert gas, e.g., argon (Ar), nitrogen (N), helium (He), xenon (Xe). If necessary, a degassing step for the device may be conducted at this point.

Referring to FIG. 2, a next step includes forming a portion 44 of a liner 46 in the opening 40 to prevent exposure of ILD layer 18 during subsequent processing. In one embodiment, portion 44 of liner 46 is no less than approximately 5% of a total liner thickness and no greater than approximately 30% of the total liner thickness, and preferably no less than approximately 10% of the total liner thickness and no greater than approximately 20% of the total liner thickness. Liner 46 includes any now known or later developed liner material including, for example, tantalum nitride, tantalum, or other refractory metals.

Subsequent processing to the sealing steps may include formation of a via as follows:

In FIG. 3, portion 22 of liner 46 and portion 42 of cap layer 16 are etched to expose metal layer 14. This etching step may be conducted in an etching chamber to which the semiconductor device is moved, or it may be conducted in the same liner deposition chamber in which the liner formation step occurs.

In FIG. 4, a via 50 is formed in the opening, for example, by depositing a metal such as copper (Cu) 24. Subsequent processing to planarize the surface (not shown) may also be required.

The above-described invention seals organic ILD layer 18 from the atmosphere and also metal layer 14 during and after degas (if provided). In addition, portion 44 of liner 46 is a "bottomless liner" which prevents, if required by the integration scheme, an excessive argon (Ar+) cleaning step.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of preventing exposure of at least one layer of a semiconductor device, the method comprising the steps of:
    etching through an interlevel dielectric (ILD) layer and partially into an underlying cap layer thereby leaving an opening through the ILD layer and a remaining portion of the underlying cap layer;
    maintaining the semiconductor device in an inert gas; and
    forming a portion of a liner in the opening to prevent exposure of the ILD layer during subsequent processing.

2. The method of claim 1, wherein the remaining portion is no less than approximately 10% of the underlying cap layer thickness and no greater than approximately 90% of the underlying cap layer thickness.

3. The method of claim 1, wherein the portion of the liner is no less than approximately 50% of a total liner thickness and no greater than approximately 30% of the total liner thickness.

4. The method of claim 3, wherein the portion of the liner is no less than approximately 10% of the total liner thickness and no greater than approximately 20% of the total liner thickness.

5. The method of claim 1, wherein the subsequent processing includes:
    etching through the portion of the liner and the portion of the underlying cap layer to expose a metal layer; and
    forming a via in the opening.

6. The method of claim 1, further comprising the step of degassing prior to the liner forming step.

7. The method of claim 1, wherein the inert gas is selected from the group consisting of:
    argon and nitrogen.

8. A method of forming a via in a semiconductor device, the method comprising the steps of:
    first etching an opening through an interlevel dielectric (ILD) layer and partially into an underlying cap layer thereby leaving a remaining portion of the underlying cap layer;
    maintaining the semiconductor device in an inert gas;
    forming a liner at the ILD layer opening and at the remaining portion wherein at least a portion of the liner in the opening is configured to prevent exposure of the ILD layer;
    second etching through the at least a portion of the liner and the remaining portion of the underlying cap layer to expose a metal layer; and
    forming the via in the opening.

9. The method of claim 8, farther comprising the step of degassing prior to the liner forming step.

10. The method of claim 8, wherein the second etching step is conducted in an etching chamber.

11. The method of claim 8, wherein the second etching is conducted in a liner deposition chamber.

12. The method of claim 8, wherein the remaining portion is no less than approximately 10% of the underlying cap layer thickness and no greater than approximately 90% of the underlying cap layer thickness.

13. The method of claim 8, wherein the portion of the liner is no less than approximately 5% of a total liner thickness and no greater than approximately 30% of the total liner thickness.

14. The method of claim 13, wherein the portion of the liner is no less than approximately 10% of the total liner thickness and no greater than approximately 20% of the total liner thickness.

15. The method of claim 8, wherein the portion of the liner includes tantalum nitride.

16. A method of forming a via in a semiconductor device, the method comprising the steps of:
    first etching an opening through an organic interlevel dielectric (ILD) layer and leaving a remaining portion of an underlying cap layer to maintain a metal layer thereunder sealed;
    maintaining the semiconductor device in an inert gas;
    degassing the semiconductor device;
    forming at least a portion of a liner in the opening to prevent exposure of the ILD layer in a chamber;
    second etching through the portion of the liner and the portion of the underlying cap layer to expose the metal layer in the chamber; and
    forming the via in the opening.

17. The method of claim 16, wherein the remaining portion is no less than approximately 10% of the underlying cap layer thickness and no greater than approximately 90% of the underlying cap layer thickness.

18. The method of claim 16, wherein the portion of the liner is no less than approximately 5% of a total liner thickness and no greater than approximately 30% of the total liner thickness.

19. The method of claim 18, wherein the portion of the liner is no less than approximately 10% of the total liner thickness and no greater than approximately 20% of the total liner thickness.

20. The method of claim 16, wherein the portion of the liner includes tantalum nitride.

* * * * *